United States Patent
Mazotti et al.

(10) Patent No.: US 7,156,562 B2
(45) Date of Patent: Jan. 2, 2007

(54) OPTO-ELECTRONIC MODULE FORM FACTOR HAVING ADJUSTABLE OPTICAL PLANE HEIGHT

(75) Inventors: William Paul Mazotti, San Martin, CA (US); Brian Scott Huss, Appleton, WI (US)

(73) Assignee: National Semiconductor Corporation, Santa Clara, CA (US)

( * ) Notice: Subject to any disclaimer, the term of this patent is extended or adjusted under 35 U.S.C. 154(b) by 78 days.

(21) Appl. No.: 10/621,035

(22) Filed: Jul. 15, 2003

(65) Prior Publication Data

US 2005/0013560 A1   Jan. 20, 2005

(51) Int. Cl.
G02B 6/42 (2006.01)
(52) U.S. Cl. .......................................... 385/92; 385/88
(58) Field of Classification Search ............. 385/88–94
See application file for complete search history.

(56) References Cited

U.S. PATENT DOCUMENTS

| | | | |
|---|---|---|---|
| 4,152,711 | A | 5/1979 | Nakata |
| 5,011,246 | A | 4/1991 | Corradetti et al. |
| 5,019,673 | A | 5/1991 | Juskey et al. |
| 5,054,870 | A | 10/1991 | Losch et al. |
| 5,076,688 | A | 12/1991 | Bowen et al. |
| 5,139,969 | A | 8/1992 | Mori |
| 5,208,879 | A | 5/1993 | Gallo et al. |
| 5,325,455 | A | 6/1994 | Henson et al. |
| 5,349,317 | A | 9/1994 | Notani et al. |
| 5,352,926 | A | 10/1994 | Andrews |
| 5,487,124 | A | 1/1996 | Bowen et al. |
| 5,515,467 | A | 5/1996 | Webb |
| 5,521,992 | A | 5/1996 | Chun et al. |
| 5,535,296 | A | 7/1996 | Uchida |
| 5,579,208 | A | 11/1996 | Honda et al. |
| 5,590,232 | A | 12/1996 | Wentworth et al. |
| 5,608,262 | A | 3/1997 | Degani et al. |
| 5,621,837 | A | 4/1997 | Yamada et al. |
| 5,723,369 | A | 3/1998 | Barber |
| 5,726,079 | A | 3/1998 | Johnson |
| 5,744,827 | A | 4/1998 | Jeong et al. |

(Continued)

FOREIGN PATENT DOCUMENTS

JP   60-202956   10/1985

(Continued)

OTHER PUBLICATIONS

Nguyen et al., "Techniques for Attaching Rotated Photonic Devices to an Optical Sub-Assembly in an Optoelectronic Package," U.S. Appl. No. 10/165,458, filed Jun. 6, 2002, 31 Pages.

(Continued)

*Primary Examiner*—Sarah Song
(74) *Attorney, Agent, or Firm*—Beyer Weaver & Thomas LLP

(57) ABSTRACT

An apparatus opto-electronic module that is flexible in design such that components of different types and dimensions can be incorporated into the module without straying from certain mechanical standards requirements is described. Generally, an opto-electronic module of the present invention includes a first substrate that supports an opto-electronic device and thereby the optical port, a second substrate that includes the electrical port, and a flexible connector that electrically connects the first and second substrates. The flexible connector allows for the first substrate and the second substrate to be positioned in various orientations with respect to each other so that optical and electrical components of various sizes can be utilized and still remain in compliance with a set of mechanical standards.

27 Claims, 7 Drawing Sheets

U.S. PATENT DOCUMENTS

| | | |
|---|---|---|
| 5,768,456 A | 6/1998 | Knapp et al. |
| 5,774,616 A | 6/1998 | Matsuda |
| 5,780,875 A | 7/1998 | Tsuji et al. |
| 5,790,384 A | 8/1998 | Ahmad et al. |
| 5,798,567 A | 8/1998 | Kelly et al. |
| 5,821,615 A | 10/1998 | Lee |
| 5,864,642 A | 1/1999 | Chun et al. |
| 5,896,479 A | 4/1999 | Vladic |
| 5,933,558 A | 8/1999 | Sauvageau et al. |
| 5,949,135 A | 9/1999 | Washida et al. |
| 6,027,254 A | 2/2000 | Yamada et al. |
| 6,030,246 A | 2/2000 | Kunishi |
| 6,043,430 A | 3/2000 | Chun |
| 6,054,759 A | 4/2000 | Nakamura |
| 6,075,284 A | 6/2000 | Choi et al. |
| 6,086,263 A | 7/2000 | Selli et al. |
| 6,201,704 B1 | 3/2001 | Poplawski et al. |
| 6,236,109 B1 | 5/2001 | Hsuan et al. |
| 6,239,427 B1 | 5/2001 | Mizue |
| 6,258,630 B1 | 7/2001 | Kawahara |
| 6,281,568 B1 | 8/2001 | Glenn et al. |
| 6,305,848 B1 | 10/2001 | Gregory |
| 6,316,837 B1 | 11/2001 | Song |
| 6,316,838 B1 | 11/2001 | Ozawa et al. |
| 6,318,902 B1 | 11/2001 | Igl et al. |
| 6,318,909 B1 * | 11/2001 | Giboney et al. ............... 385/90 |
| 6,356,686 B1 | 3/2002 | Kuczynski |
| 6,364,542 B1 | 4/2002 | Deane et al. |
| 6,450,704 B1 | 9/2002 | O'Connor et al. |
| 6,497,518 B1 | 12/2002 | Deane |
| 6,583,902 B1 | 6/2003 | Yuen |
| 6,595,699 B1 | 7/2003 | Nguyen et al. |
| 6,599,033 B1 | 7/2003 | Pohnke |
| 6,619,858 B1 * | 9/2003 | Lytel et al. .................... 385/89 |
| 6,624,507 B1 | 9/2003 | Nguyen et al. |
| 6,635,866 B1 | 10/2003 | Chan et al. |
| 6,655,854 B1 | 12/2003 | Nguyen et al. |
| 6,702,480 B1 | 3/2004 | Sparacino |
| 6,703,561 B1 * | 3/2004 | Rosenberg et al. ......... 174/52.5 |
| 6,707,140 B1 * | 3/2004 | Nguyen et al. .............. 257/686 |
| 6,792,171 B1 * | 9/2004 | Hargis et al. .................. 385/14 |
| 6,821,027 B1 * | 11/2004 | Lee et al. ...................... 385/89 |
| 6,916,121 B1 | 7/2005 | Mazotti et al. |
| 6,923,580 B1 * | 8/2005 | Ohno et al. .................... 385/92 |
| 2001/0013645 A1 | 8/2001 | King et al. |
| 2001/0048151 A1 | 12/2001 | Chun |
| 2002/0136502 A1 | 9/2002 | Bachl et al. |
| 2003/0026081 A1 | 2/2003 | Liu et al. |
| 2003/0026556 A1 | 2/2003 | Liu et al. |
| 2003/0169980 A1 * | 9/2003 | Yang ........................... 385/92 |
| 2003/0201462 A1 | 10/2003 | Pommer et al. |
| 2004/0091208 A1 | 5/2004 | Doi |

FOREIGN PATENT DOCUMENTS

JP    08125066    5/1996

OTHER PUBLICATIONS

S. Savastiouk, PH.D., et al. "3-D stacked wafer-level packaging", Mar. 2000, *Advanced Packaging*, pp. 28-34.

National Semiconductor, "Packaging Databook", *1993 National Semiconductor*, pp. v-xi to 1-3 to 1-4, 3-1 to 3-20, 3-30 to 3-31, 3-62 to 3-69. Please note: The year of publication is sufficiently earlier than the effective U.S. filing date so that the particular month of publication is not in issue.

\* cited by examiner

OPTO-ELECTRONIC MODULE FORM FACTOR HAVING ADJUSTABLE OPTICAL PLANE HEIGHT

CROSS-REFERENCE TO RELATED APPLICATIONS

This application is related to U.S. Pat. No. 6,364,542, entitled "DEVICE AND METHOD FOR PROVIDING A TRUE SEMICONDUCTOR DIE TO EXTERNAL FIBER OPTIC CABLE CONNECTION," to U.S. patent application Ser. No. 09/568,558, entitled "ARRAYABLE, SCALABLE AND STACKABLE MOLDED PACKAGE CONFIGURATION," filed on May 9, 2000, to U.S. Pat. No. 6,497,518, entitled "MINIATURE OPTO-ELECTRIC TRANSCEIVER," to U.S. patent application Ser. No. 09/922,358, entitled "MINIATURE SEMICONDUCTOR PACKAGE FOR OPTOELECTRONIC DEVICES," filed on Aug. 3, 2001, to U.S. patent application Ser. No. 10/165,553 entitled "OPTICAL SUB-ASSEMBLY FOR OPTO-ELECTRONIC MODULES," filed on Jun. 5, 2002, and to U.S. patent application Ser. No. 10/165,711 entitled "CERAMIC OPTICAL SUB-ASSEMBLY FOR OPTOELECTRONIC MODULES," filed on Jun. 5, 2002, to U.S. patent application Ser. No. 10/165,548, entitled "TECHNIQUES FOR ATTACHING ROTATED PHOTONIC DEVICES TO AN OPTICAL SUB-ASSEMBLY IN AN OPTELECTRONIC PACKAGE," the content of each of which are hereby incorporated by reference.

FIELD OF THE INVENTION

The present invention relates generally to opto-electronic modules, and more specifically to opto-electronic modules that are flexible in design such that various optical and electrical components can be fit within certain form factors.

BACKGROUND OF THE INVENTION

Opto-electronic modules are devices that combine optical with electrical devices in order to take advantage of capabilities presented by each field of technology. For instance, the optical devices open the door to optical transmission of signals, which allows for very high data transmission bandwidths. On the other hand, the electrical devices provide the ability to perform the conventional operations of storing and manipulating the transmitted signals. Generally, an optical device is directly or indirectly attached to a semiconductor device such that the optical device sends and receives optical data signals and the semiconductor device converts the optical signals to electrical signals. These converted electrical signals can then be manipulated with standard semiconductor devices, for example, a chip set. The opto-electronic module usually includes the combined optical and electrical devices which are inserted within a protective case. This case allows the module to be easily and safely handled during the construction of a system for computing, transmissions, or the like.

These opto-electronic modules are produced by numerous equipment manufacturers. As such, dimensional standards for opto-electronic modules have developed so that modules produced by various manufactures can fit with various systems. These standards are also referred to as "form factors." Typically, an OEM will require a standard form factor which in turn forces component suppliers to work together and develop a set of fixed constraints (e.g. footprint dimensions, electrical pinout, connector type). One such standards agreement is the Multi-Source Agreement for Small Form Factor Pluggable (SFP) Modules (for Gigabit Ethernet and FiberChannel applications). These form factors are typically application specific. In most cases, the standards are confined to outer dimensions of a module, which define how a module should mechanically interface with other systems. For example, the positioning of it's electrical and/or optical ports are usually required to be within specific positions with respect to each other. One such requirement is the height of each of the optical and electrical ports from a bottom surface of an opto-electronic module. In another case, the relative difference in height of the optical and electrical ports is specified to be within a certain dimensional window.

The dimensional requirements internal to the module, i.e., within the protective case, are not usually specified because the internal architecture is left to the suppliers' discretion for design, component selection, and integration. The chosen internal architecture must only 'fit' within the standard form factor package and interface to electrical and optical Inputs/Outputs.

Currently, opto-electronic modules are designed such that conventional optical and electrical components fit within standard form factors. For instance, many configurations for optical and electrical components are suited for use of TO can optical components. Many optical components are connected to the electrical components through wires that transmit conventional singled ended electrical signals. Single ended signals are commonly used in interfaces and buses within computing systems due to its simplicity and ease of implementation. Single ended signals are transmitted by using a positive voltage as a "one" and a zero voltage (ground) as a "zero." Unfortunately, problems within a bus or an port can arise due to bouncing signals, interference, degradation over distance and cross-talk from adjacent signals. These problems become more severe as the speed of a system increases, the longer a transmission distance becomes (e.g., when the length of a cable increases). As a result, the length of the wires that connect the optical devices and the electrical devices are very limited. The short wires provide little room for adjusting the position of the optical device with respect to the electrical device such that the optical and electrical ports are positioned within a required positional window. This is increasingly problematic as the transmission speeds of opto-electronic modules increase since the length of the wires further shorten. The limitations created by the wire length thereby cause opto-electronic systems to be quite inflexible to accommodating optical and electrical devices of various types and shapes (e.g., alternative lower cost, higher reliability, and higher data rate components). Such inflexibility also limits the types of materials that can be used within an opto-electronic module.

FIGS. 1–3 illustrate diagrammatic views of a common opto-electronic (OE) module 100 according to the current state of the art. OE module 100 can be used, for example, for serving as the intermediate connector between optical fibers and a computer, mainframe, router, switch, or the like. It could be said that opto-electronic module 100 is similar to a small form factor pluggable (SFP) manufactured by Agilent Technologies, model number HFBR-5720L. Information about model number HFBR-5720L can be found at www.Agilent.com. FIG. 1 illustrates a perspective view of OE module 100. OE module 100 includes a case 102 having openings 104 and 106 at each end in order to provide access to the internal components contained within case 102. Opening 104, referred to as an optical interface opening 104, provides access to the optical devices 108, which are used to send, receive, or send and receive optical signals from optical transmission mediums such as optical fibers. The mechanical components for making a connection between optical devices 108 and optical transmission mediums are collectively referred to as an optical port. In FIG. 1, optical port 110 includes the cylindrical tubes that present themselves at optical interface opening 104. Each cylindrical tube of optical port 110 is shaped to receive an optical transmission fiber. Opening 106, referred to as an electrical interface opening 106, provides access so that an electrical connection between electrical contacts of the internal components can be made with an electrical system that is external to the OE module 100. The internal components will be more clearly shown in the following FIGS. 2 and 3.

Case 102 should have a shape that allows OE module 100 to fit into and within systems that intend to incorporate module 100. As discussed earlier, many manufacturers produce OE modules in compliance with standards agreements in order to ensure interoperability with various systems. For instance, the outer dimensions of case 102, the size, height and other specifics regarding openings 104 and 106, and the position and size of the optical and electrical ports, are just some of the proportions of OE module 100 that might be required to within certain dimensional constraints. Other specifics such as material composition may also be required to satisfy certain criteria.

FIG. 2 illustrates a cross-sectional view of OE module 100 along line 2—2. FIG. 2 shows the internal components of OE module 100 positioned within case 102. FIG. 3 will also be referenced along with FIG. 2 since FIG. 3 illustrates a perspective view of the internal components of OE module 100. The internal components include the optical devices 108 and a single printed circuit board (PCB) 112, which supports various semiconductor chip packages 114 and electrical components 116 (e.g., transistors, capacitors, and the like). Optical port 110 is shown as protruding out of optical interface opening 104 for connection with optical transmission mediums. An electrical port 118 formed at one end of the PCB 112 is designed for connection with an external system (e.g., a router or a switch). Electrical port 118 includes electrical contacts 120 formed on the top and/or bottom surface of PCB 112. Printed circuitry lines 122 run across the surface of PCB 112 to connect electrical contacts 120 and other components on PCB 112 with each other.

As shown in FIG. 3, but more clearly in FIG. 2, optical devices 108 are connected to PCB 112 through electrical wires 124. Since optical devices 108 are designed to output singled ended signals, wires 124 must be an appropriate length so that electrical properties are maintained at a certain level. For instance, the length of wires 124 should be short enough so that electrical parasitics (specifically, inductance) levels can be minimized. With today's high transmission requirements, the length of wires 124 are desirably kept to a minimum. Unfortunately, this limits the range in which optical device 108 can be positioned relative to PCB 112. More importantly, this affects the range in which the optical port 110 can be positioned with respect to the electrical port 118. Standards agreements typically will require that the optical plane height 126 be within a certain height range with respect to the bottom 128 of OE module 100. The optical plane is typically, the height at which the optical device 108 connects with an optical fiber. Such requirements also require that the electrical plane height 130 be within a certain height range with respect to the bottom 128 of the OE module 100. Some requirements pertain to having the optical plane height and the electrical plane height within a certain distance from each other. Ultimately, the short wires 124 limit the flexibility of positioning the optical port 110 with respect to the electrical port 118. This is especially problematic when changes to the components within OE module 100 are desired.

Other common OE modules include model number FTRJ-1321-7D by Finisar and model number V23818-M305-B57 by Infineon Technologies AG.

In view of the foregoing, an opto-electronic module that is flexible in design such that opto-electronic modules of different types and dimensions can be properly contained within a case that complies within dimensional standards requirements would be desirable.

BRIEF SUMMARY OF THE INVENTION

The present invention pertains to an opto-electronic module that is flexible in design such that components of different types and dimensions can be incorporated into the module without straying from certain mechanical standards requirements. Generally, the opto-electronic module of the present invention includes a first substrate that supports an opto-electronic device and thereby the optical port, a second substrate that includes the electrical port, and a flexible connector that electrically connects the first and second substrates.

One aspect of the invention pertains to an opto-electronic module having an optical port and an electrical port. This opto-electronic module has a first substrate having electrical traces, a port end, and an interior end, an opto-electronic device attached to and electrically connected to the first substrate wherein the opto-electronic device serves as the optical port, a second substrate having electrical traces, the second substrate having a port end and an interior end, wherein the port end forms the electrical port, and a flex connector that is a flexible band containing a plurality of electrically conductive wires, wherein the flex connector connects the electrical traces within first and the second substrates, whereby the flex connector allows for the adjustable positioning of the height of the optical port with respect to the height of the electrical port.

In an alternative embodiment of the invention, the flexible band of electronic transmission lines is suitable for transmitting differential signals between the first and the second substrate.

Another aspect of the invention pertains to opto-electronic system having two paralle substrates and an opto-electronic unit attached to each substrate. The two parallel substrates each have an inside surface wherein the inside surfaces face each other. The opto-electronic units attached to each of the inside surfaces of the substrates include a first circuit board that is attached to the inside surface of one of the substrates, a second circuit board that is positioned substantially coplanar to and adjacent to the first circuit board, a flexible band of electrical transmission lines that connects and provides electrical communication between the first and second circuit board, and an optical device that is directly or indirectly attached to a surface of the second circuit board, wherein the optical device of each opto-electronic unit face each other such that optical signals can be transmitted between each of the optical devices.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to an opto-electronic module that is flexible in design such that components of different types and dimensions can be incorporated into the module without straying from certain mechanical standards requirements. Generally, the opto-electronic module of the present invention includes a first substrate that supports an opto-electronic device and thereby the optical port, a second substrate that includes the electrical port, and a flexible connector that electrically connects the first and second substrates. The flexible connector allows for the first substrate and the second substrate to be positioned in various orientations with respect to each other so that optical and electrical components of various sizes can be utilized and still remain in compliance with a set of mechanical standards. Most frequently, the relative position, whether horizontal or vertical, between the electrical and optical ports are specified by a standards agreement.

The OE modules of the present invention can be used in data communication and telecommunication systems. For example, the electrical ports of the OE modules can be plugged into datacom/telecom line cards within a networking router/switch while the optical ports are connected to optical transmission mediums such as optical fibers.

Figure 1:
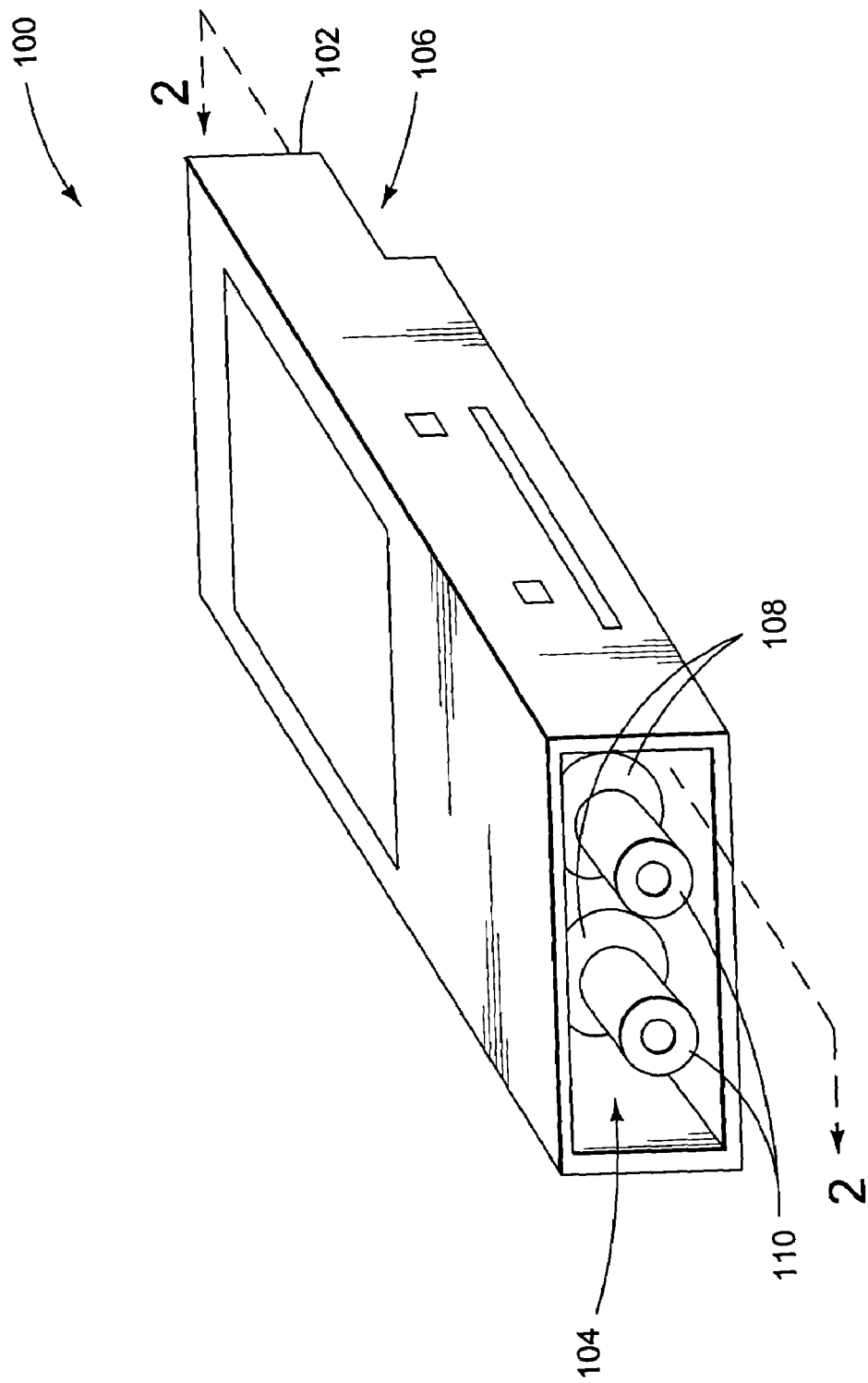
FIG. 1 illustrates a perspective view of a known OE module.
Figure 2:
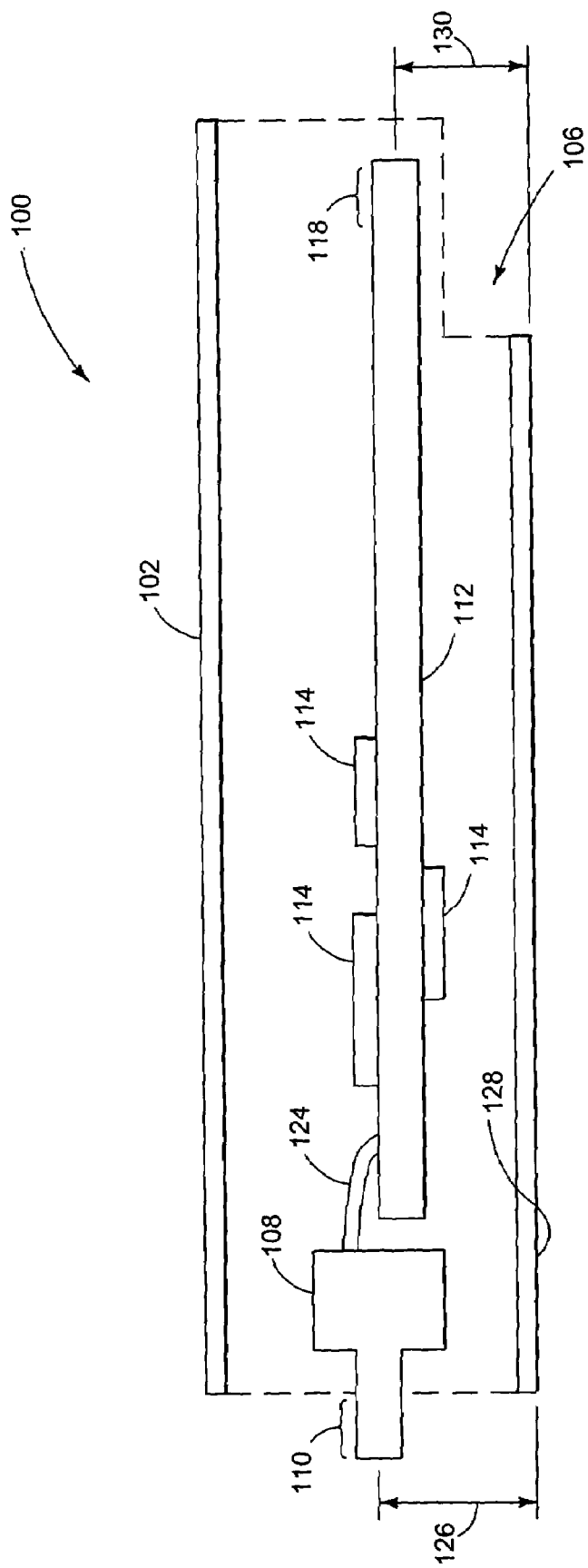
FIG. 2 shows the internal components of the OE module of FIG. 1 where it is positioned within a case.
Figure 3:
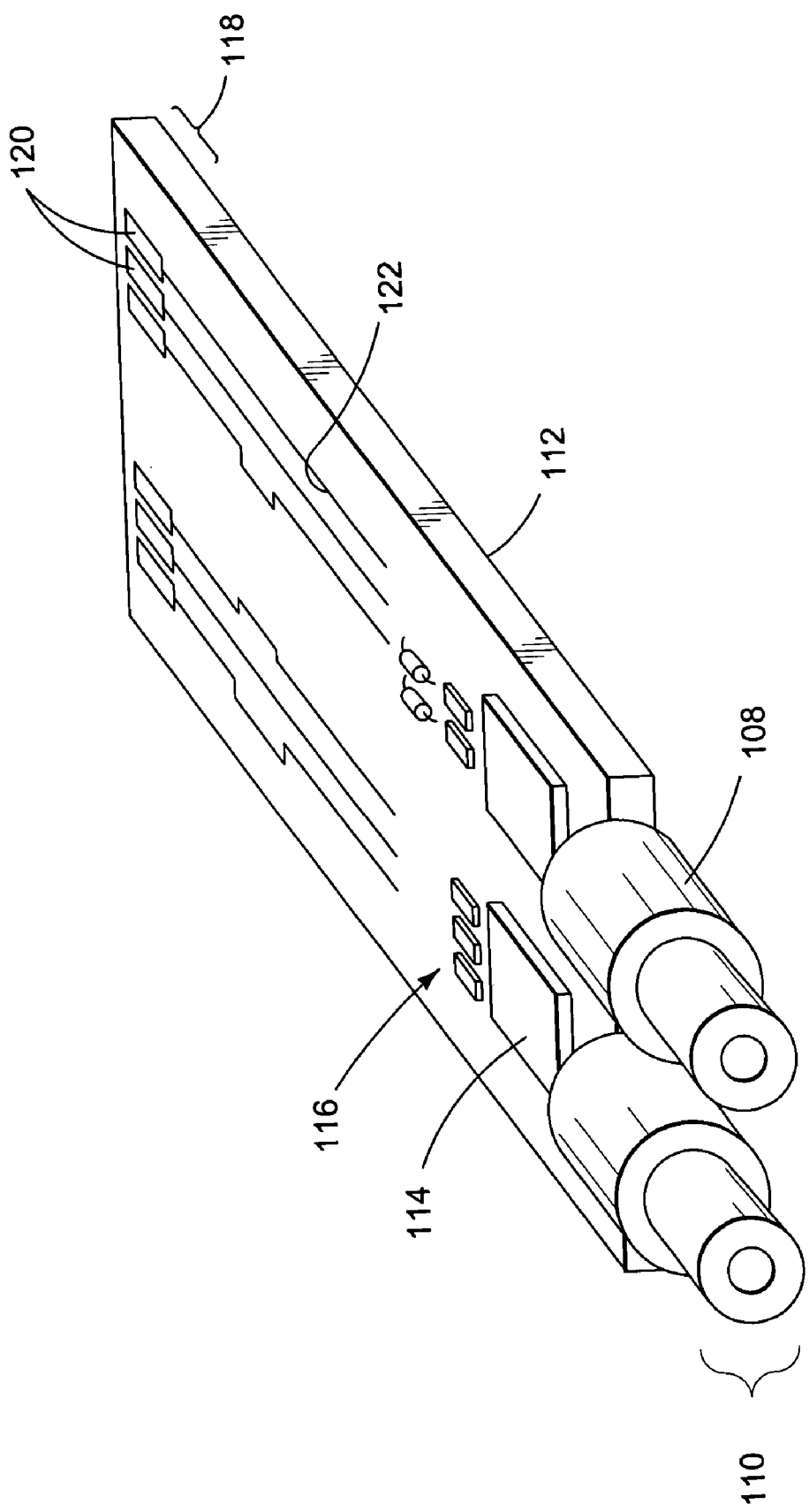
FIG. 3 illustrates a perspective view of the internal components of the OE module of FIGS. 1 and 2.
Figure 4:
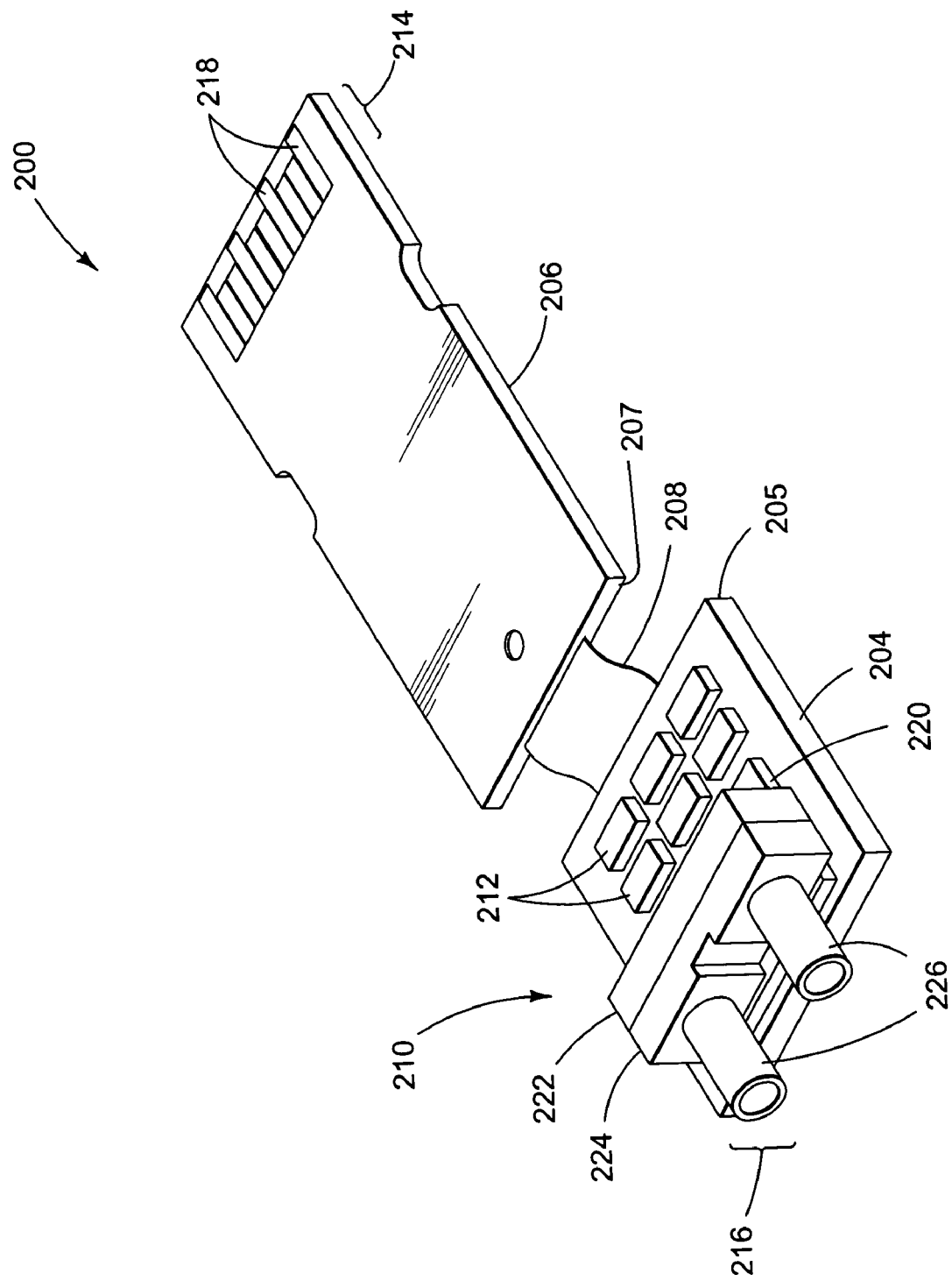
FIG. 4 illustrates a perspective view of an opto-electronic system according to one embodiment of the present invention.
Figure 5:
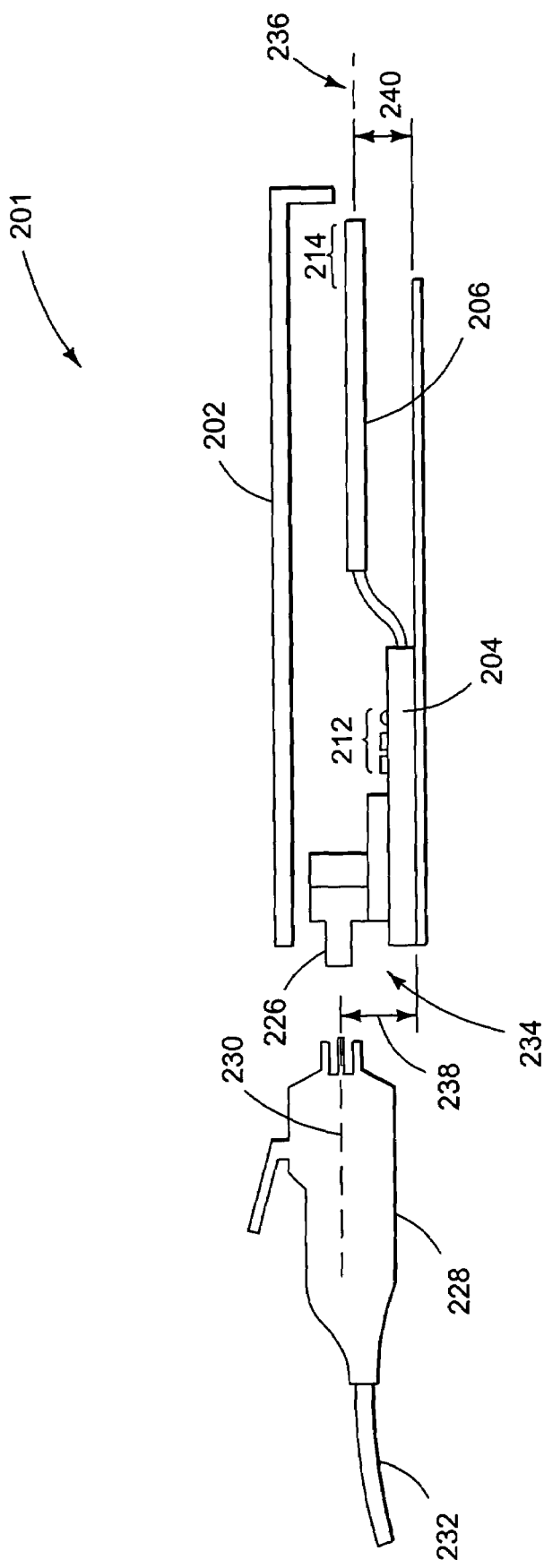
FIG. 5 illustrates a side, cross-sectional view of an OE system that is placed within a protective case such that an OE module is formed.

FIG. 4 illustrates a perspective view of an opto-electronic (OE) system 200 according to one embodiment of the present invention. In most embodiments, OE system 200 is designed to fit within a protective case to form an opto-electronic module 201 such that the module complies with a set of mechanical standards. FIG. 5 illustrates a side, cross-sectional view of OE system 200 that is placed within a protective case 202 such that an OE module 201 is formed. The following discussion will reference both FIGS. 4 and 5.

OE system 200 includes a substrate 204, which is connected to another substrate 206 through a flexible connector 208. Flexible connector 208 allows substrate 204 and 206 to be moved with respect to each other so that they and the components attached to them may fit within certain standards requirements. Substrate 204 can be referred to as the OE support substrate 204 since it is attached to and supports an OE device 210. OE support substrate 204 also is attached to and supports various electrical components 212, which are used for the purpose of noise and power supply decoupling. Substrate 206 can be referred to as the electrical interface substrate 206 since one end of substrate 206 forms an electrical port 214.

OE system 200 can be formed in a variety of manners. In one embodiment, substrates 204 and 206 and flexible connector 208 are originally formed out of a single substrate. This substrate contains at least internal electrical circuitry. The flexible connector 208 is formed by removing enough of the relatively rigid substrate material between the portions that will form substrates 204 and 206 such that the remaining material (including electrical circuitry) becomes flexible. This flexible region forms flexible connector 208, which connects substrates 204 and 206 and allows for the ability to adjustably position the substrates relative to each other. An etching process can be used to remove the relatively rigid substrate material from the substrate. In another embodiment, two separately formed substrates can form each of substrates 204 and 206 and a separate piece or band of flexible and conductive traces can be connected to each of the substrates. The piece of or band of flexible and conductive traces forms flexible connector 208.

OE system 200 has an optical port 216 and the electrical port 214 at each end so that one end of system 200 can be interfaced with an optical transmission medium such as an optical fiber and the other end can be interfaced with an electrical system such as a router, a switch, a mainframe, a personal computer, a server, or the like.

OE support substrate 204 is sized so that the substrate can support OE device 210 and the various electrical components 212. The dimensions of substrate 204 should be such that they allow system 200 to fit within certain standard requirements. The thickness of substrate 204 can directly affect the configuration of the OE module 201 since the height of the OE device 210 depends upon the thickness of the substrate. As will be described below, "optical plane" of OE device 210 is typically required to be at a certain height with respect to a bottom plane of OE system 200 or within a certain height with respect to the "electrical plane." The optical plane is the plane in which an optical transmission medium interfaces with the optical port 216. Specifically, the optical transmission medium should make contact with what is known as a photonic device. Photonic devices are the devices that actually transmit or receive optical data signals. The electrical plane is the plane in which an external electrical system interfaces with electrical port 214. In other words, the electrical plane is the plane in which electrical interface substrate 206 plugs into another system.

Electrical interface substrate 206 can also support various electrical components 212. However, in some embodiments, substrate 206 does not support electrical components 212 and functions mainly to support circuitry that connects one end of the substrate to the other. Specifically, such circuitry connects electrical contacts 218, which formed electrical port 214. Electrical contacts 218 can be formed on the top and/or bottom surfaces of electrical interface substrate 206. The dimensions of substrate 206 should be such that they allow system 200 to fit within certain standard requirements.

OE support substrate 204 and substrate 206 have circuitry that is embedded or on a top and/or bottom surface of substrate 204. Such circuitry is used to interconnect the various components mounted onto either the top or bottom surfaces of the substrate. In one common embodiment, substrates 204 and 206 are resin-based printed circuit boards. Substrates 204 and 206 are typically substantially rigid. Such rigidity allows for certain components and ports to be positioned in certain orientations with a degree of certainty.

OE device 210 generally includes one or more photonic devices that are directly or indirectly connected to a semiconductor device. As discussed above, the photonic device functions to send and receive optical data signals and the semiconductor device acts to convert the optical signals from the photonic devices into electrical signals and vice-versa. The height at which the photonics are located typically determines the optical plane height, unless various mirrors and/or lenses alter the height.

OE device 210 as shown in FIG. 4 includes a semiconductor chip package 220, a support block 222, and a barrel unit 224. It is not shown in FIG. 4 or 5, but at least one photonic device is attached to support block 222. See FIG. 6 for one embodiment of an OE device 300 wherein the photonic devices 302 are shown. Semiconductor chip package 220 is any type of package having a semiconductor chip that is at least partially encapsulated within a protective material, such as epoxy or resin. Chip package 200 should have electrical traces and/or contacts tat allow for electrical connection with support block 222. In one embodiment, a semiconductor die within the chip package will have uplinking electrical contacts formed directly on the top surface of the die. These uplinking contacts are exposed through the top surface of the chip package 220 and thereby can be connected to contact pads of support block 222. Traces on the surface or within support block 222 serve to connect chip package 220 to the photonic devices attached to support block 222. In FIGS. 4 and 5, the photonic devices are attached to the front face of support block 222, which is the face to which barrel unit 224 is attached. The hollow barrels 226 provide access for an optical connection to a transmission medium. Barrels 226 also serve as the optical port 216 to which optical transmission mediums can be plugged into. As shown in FIG. 5, ferrule 228 is aligned in the optical plane 230 so that optical fiber 232 can be connected to optical port 216. Barrel unit 224 can have various shapes and sizes, For instance, barrel unit 224 can have a large number of barrels wherein each barrel provides access to one or more photonic devices. These barrels 226 can also have various shapes to accommodate varying numbers of fibers and different shaped ferrules. All of the components 220, 222, and 226 can have various shapes and sizes to accommodate various standards and requirements.

In one embodiment, the optical port protrudes through the optical port opening 234 of case 202. In other embodiments, the optical port is recessed with optical port opening 234 and ferrules are inserted into case 202.

OE device 210 is electrically connected to OE support substrate 204 wherein the traces on substrate 204 connect OE device 210 to various electrical components 212. Traces on substrate 204 eventually connect to flex connector 208, which connects to electrical interface substrate 206. Ultimately, electrical traces and connections of OE system 200 allow optical signals from a transmission medium to be received, converted to electrical signals, and then be sent to electrical port 214, and vice-versa.

Flex connector 208 is a flexible band of electrical conductive wires that transmits signals between substrates 204 and 206. As discussed above, flex connector 208 and substrates 204 and 206 can be integrally formed from a single substrate, such as a printed circuit board. Also, flex connector 208 can be formed from a separately formed band of conductive traces, such as a band of wires. Typically, such a band of wires are protected in a pliable protective material such as a soft plastic.

Flex connector 208 is attached at the interior edges 205 and 207 of first and second substrates 204 and 206, respectively. The width of flex connector 208 is in part dependent upon the number wires aligned within. The number of wires is dependent upon the OE system requirements. The length of flex connector 208 determines how much leeway is provided with respect to the relative positioning of substrates 204 and 206. For example, a longer flex connector 208 allows for substrates 204 and 206 to be positioned farther apart with respect to their heights and/or horizontal separation. Flex connector 208 allows for flexibility in the design and component selection of OE module 201 since substrates 204 and 206 can be moved into various positions.

In one embodiment, flex connector 208 has a thickness that is approximately one-half of that of each of substrates 204 and 206. For example, substrates 204 and 206 can have a thickness of approximately 1 mm and flex connector will have a thickness of approximately 0.5 mm. The length of flex connector 208 can vary between approximately 5–10 mm. However, the length of flex connector 208 can be longer or shorter depending upon the particular constraints. Also, in one embodiment each trace within flex connector 208 can be approximately 0.125 mm width. Spacing between each trace is dependent on routing requirements with a minimum space of approximately 0.125 mm between trace.

In one embodiment, each flex connector has four layers of traces. The top layer routs high speed signal lines. The next layer down will be power, followed by a ground plane layer, and then control signals on the bottom layer.

Alignment between the optical plane 230 and the electrical plane 236 is a common design point of OE modules. In some instances, standards require optical plane 230 and electrical plane 236 to have certain heights 238 and 240 with respect to a bottom of OE module 201. Usually, these standards require that the plane heights be within a certain window. In other instances, these standards require that optical plane 230 be within a certain height window with respect to the electrical plane. As seen in FIG. 5, flex connector 208 allows substrate 206 to be positioned in a higher plane that that of OE support substrate 204 so that electrical plane 236 and optical plane 230 can be within a certain height window from each other.

Flex connector 208 provides flexibility in the horizontal direction also. For instance, in FIG. 5, case 202 could be longer or shorter and flex connector 208 would allow substrates 204 and 206 to be spaced farther apart or closer together to better fit case 202. This is useful when a relatively long OE device must fit within a standard or shorter than normal case 202.

In one embodiment, data is transmitted across flex connector 208 using differential signals, as opposed to single ended signals. Differential signals are less susceptible to electrical interference and therefore allow flex connector 208 to be longer than in the case where single ended signaling is used. This in turn allows flex connector 208 to provide additional flexibility in the arrangement of the optical plane and the electrical plane.

Differential signaling uses two wires for each signal that are mirror images of each other. For a logical "zero", zero voltage is sent on both wires. For a logical "one", the first wire of each signal pair contains a positive voltage, but not necessarily at the same voltage. The second wire contains the electrical opposite of the first wire. The circuitry at the receiving device takes the difference between the two signals sent, and thus sees a relatively high voltage for a one, and a zero voltage for a zero.

Typically, photonic devices output and receive single ended signals. Therefore, an electrical converter, a well-known device, is necessary to convert the single ended signals from the photonic devices into differential signals, and vice-versa. In one embodiment, the electrical converter is located on the support block (e.g., support block 222 in FIG. 4) at a position that minimizes the distance between the converter and the photonic devices. In this way, the distance that single ended signals must travel is minimized, thereby minimizing problems of electrical interference. The electrical converter and the electrical circuitry connecting the electrical converter and the photonic devices can be on the surface of or embedded within the support block. With respect to FIGS. 4 and 5, the electrical converter allows differential signals to travel on the surface or through support block 222, through semiconductor chip package 220, through the various electrical components 212 if necessary, through flex connector 208, and ultimately to electrical port 214.

In alternative embodiments, single ended signals are transmitted to various points in the OE device 210 and in OE support substrate 204. One or more electrical converters can be placed anywhere along a path that leads to flex connector 208. The farthest point from the photonic devices that electrical converters should be placed is just before flex connectors 208 since differential signals should be sent across flex connector 208.

Figure 6:
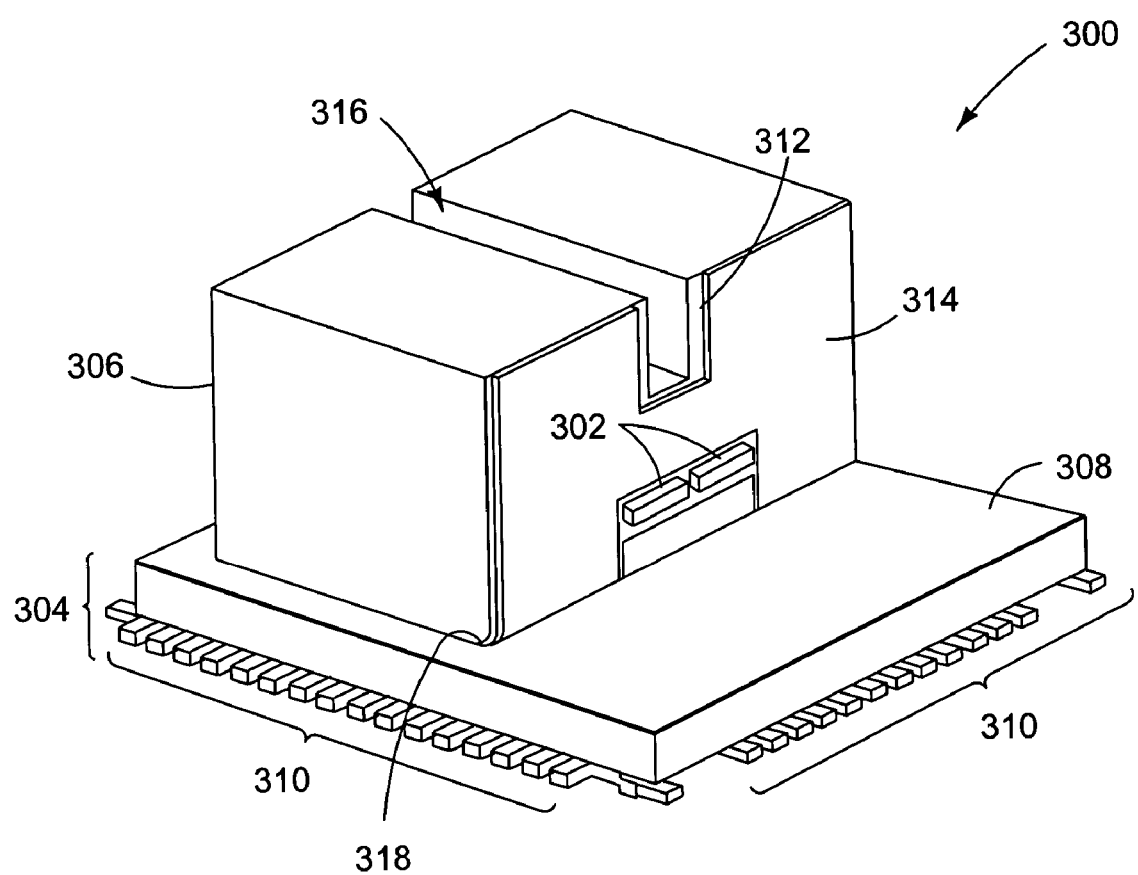
FIG. 6 illustrates one embodiment of an OE device.

OE device 210 can be of various designs since flex connector 208 provides the flexibility so that the various devices can fit within certain standards requirements. For instance, FIG. 6 illustrates one embodiment of an OE device 300 that is similar to OE 210 of FIGS. 4 and 5. OE device 300 is made up of a chip package 304, a support block 306, and photonic devices 302. Chip package 304 is shown to be a leadless leadframe package (LLP) that has a molded plastic package 308 with contact leads 310 that protrude from the bottom surface. Chip package 304 can be of various types as well. For instance, chip package 304 can be of any type that connects both to substrate 204 and to one or more photonic devices.

A flexible circuitry tape 314 is adhered to the front surface 312 and the bottom surface of support block 306. Photonic devices 302 that are attached to the flexible circuitry tape 314. Support block 306 need not have a strictly block shape as shown in FIG. 6. In some embodiments, it is preferable to have a somewhat triangular shape for manufacturing ease. A slot 316 is formed in the top surface of support block 306. One of the purposes of slot 316 is to facilitate attachment of a protective case (e.g., case 202 of FIG. 5) over an OE system.

Some embodiments of support block 306 do not require attachment to a flexible circuitry tape because electrical traces are embedded within or formed on the surface of support block 306. For example, such traces can be formed in or on a multi-layered ceramic support block where traces are routed between the layers for signal integrity purposes.

Support block 306 can be formed of a variety of materials, however, it is preferable to form the support block 306 from polyethylene ether ketone (PEEK) or liquid crystal polymer (LCP). It is also possible that support block 306 can be formed of polyphenylene sulfide (PPS) or ceramic (e.g., $Al_2O_3$).

Flexible circuitry tape 314 forms the electrical interface, which connects the photonic devices 302 to chip package 304. Flexible circuitry tape 314, referred to as "flex," is a flexible tape material having embedded electronic circuit traces. Flex 314 covers the front surface 312 of support block 306, wraps around the bottom-front corner 318 of support block 306, and covers most of the bottom surface of support block 306. The traces within flex 314 run from photonic devices 302 on the front surface to the bottom surface of support block 306 where they make contact with up-linking, electrical contacts on chip package 304.

Two photonic devices 302 are shown to be connected to flex 314. In this embodiment, photonic devices 302 contain an array of VCSELs and the other contains an array of optical detectors. The combination of laser emitters and detectors makes OE device 300 a transceiver. For instance a 4-channel transceiver may be formed of one 1×4 laser emitter array and one 1×4 detector array. However, in alternative embodiments, only one array of laser emitters are be connected to support block 306, thereby making OE device 300 a transmitter. For instance, a twelve-channel transmitter can have a single 1×12 VCSEL array module with 12 fiber connections. Likewise, in another alternative embodiment, only one array of detectors is connected to support block 306, thereby making OE device 300 a receiver. For instance, a twelve-channel detector can have a single 1×12 detector array module with 12 fiber connections.

OE device 300 is convenient because an electrical converter can be attached to front face 312 of support block 306 so that single ended signals can be converted to differential signals at a point close to photonic devices 302.

Again, various types of OE devices can be utilized with the present invention since a flex connector that attaches a first and second substrate allows for positional adjustment between the substrates and therefore the optical and electrical planes. For example, conventional TO can'd optical devices can be attached to the OE support substrate, while a flex connector allows an electrical interface substrate to be moved with respect to the OE support substrate. Other photonic devices can be of various types ranging from LEDs, VCSEL'S, PINs, edge-emitting lasers, etc.

An alternative embodiment of the present invention can be formed wherein a flex connector, such as flex connector 208, is not required. Instead, an OE support substrate and an electrical interface substrate can be connected through an intermediate substrate. In this embodiment, the OE support substrate and the electrical interface substrate sandwich the intermediate substrate. The intermediate substrate is formed to have a thickness that allows the OE support substrate and the electrical interface substrate to be positioned at a desired offset in the horizontal direction. The intermediate substrate typically has a length that is shorter than the OE support substrate and the electrical interface substrate. The intermediate substrate need only have a length that allows the OE support substrate and the electrical interface substrate to be securely attached to the intermediate substrate. Electrical traces run through the intermediate substrate so to electrically connect the OE support substrate and the electrical interface substrate.

Figure 7:
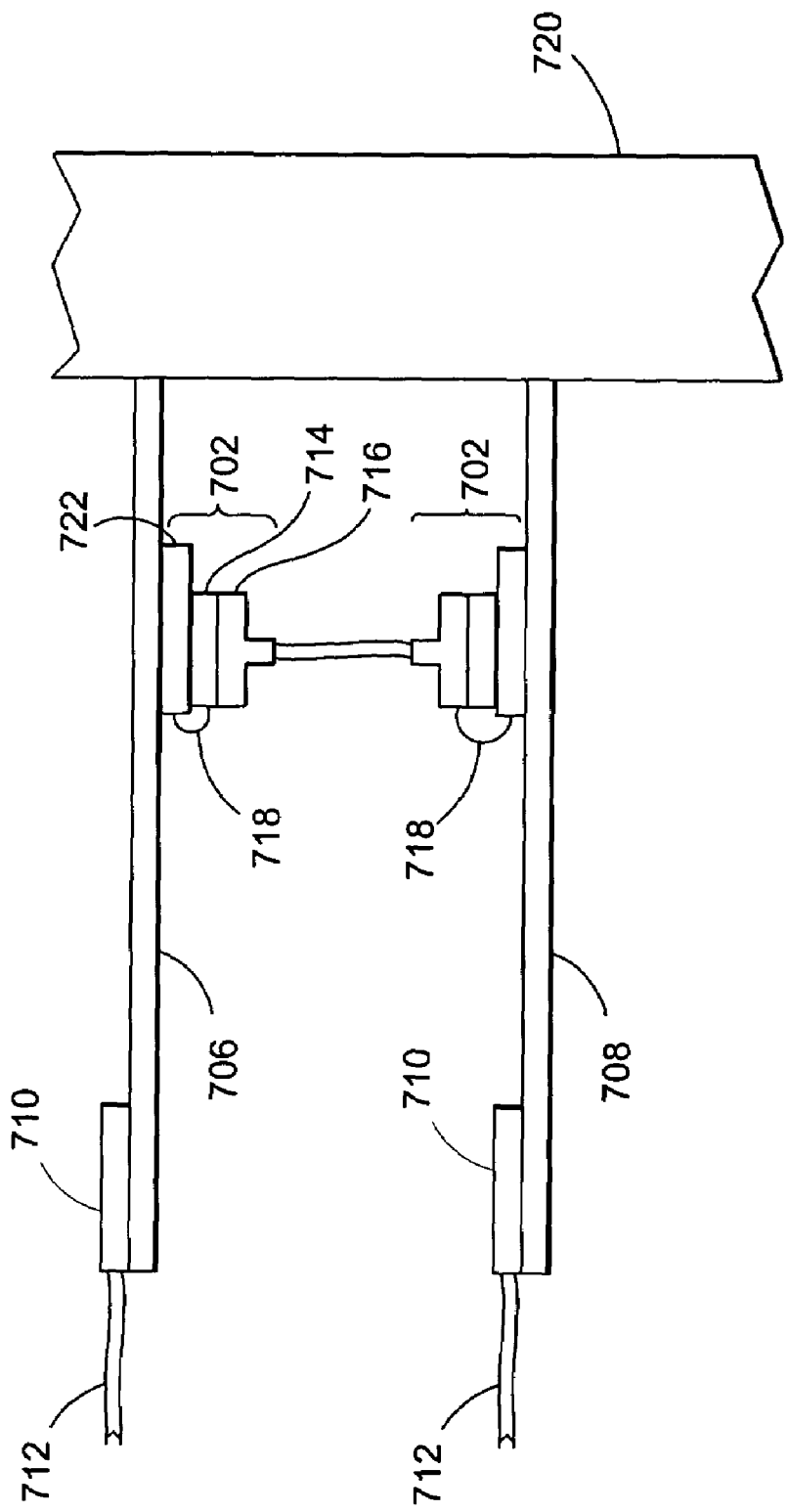
FIG. 7 illustrates a side view of two OE units that are utilized to form an internal line card to line card connection.

FIG. 7 illustrates a side view of two OE units 702 are utilized to form an internal line card to line card connection. OE units 702 provide for optical communication between two adjacent line cards 706 and 708. Line cards 706 and 708 are connected to a back plane 720. OE devices 710 located on the end of line cards 706 and 708 are connected to optical fibers 712. OE systems 702 each include a first substrate 714 that support an optical device 716, a flex connector 718, and a second substrate 722 which is connected to one of the line cards 706 or 708. The first and second substrates 714 and 722 are stacked on top of each other and can be directly or indirectly attached to each other. Advantage is that this configuration can create an optical link (board to board) deep within a line card, thereby not crowding the line card port side.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An opto-electronic module having an optical port and an electrical port comprising:
   a planar first substrate having a top surface and a bottom surface, electrical traces, a port end, and an interior end;
   an opto-electronic device attached to and electrically connected to the top surface of the first substrate wherein the opto-electronic device serves as the optical port wherein the opto-electronic device comprises:
   a semiconductor chip package having a top surface and a bottom surface with top and bottom electrical contacts, the bottom surface mounted directly on the top surface of the first substrate with the bottom electrical contacts at the bottom surface of the chip package being electrically connected to the electrical traces of the first substrate;
   a support block for supporting an optical device package, the support block having a first face and a second face that are angled relative to one another with electrical traces that extend from the first face to the second face wherein the first face of the support block is mounted on the top surface of the chip package so that the top electrical contacts of the chip package are electrically coupled to associated traces on the support block; and
   an optical device package mounted on the second face of the support block, the optical device package having at least one active facet thereon and having electrical contacts that are electrically coupled to associated traces on the support block;
   a second planar substrate having electrical traces, the second substrate having a port end and an interior end, wherein the port end forms the electrical port;
   a flex connector that is a flexible band containing a plurality of electrically conductive lines, wherein the conductive lines of the flex connector electrically connect the electrical traces of the first and the second substrates, whereby the flex connector allows for the adjustable positioning of the height of the optical port with respect to the height of the electrical port; and
   an external ease configured to enclose the first and second substrates as well as all components mounted thereon, the case enabling optical communication between the optical device package and an external optical component and enabling electrical connection to the port end of the second substrate.

2. An opto-electronic module as recited in claim 1 wherein the conductive lines of the flex connector are suitable for transmitting differential signals between the first and the second substrate.

3. An opto-electronic module as recited in claim 2 wherein the conductive lines of the flex connector are connected to the interior end of the second substrate and the interior end of the first substrate.

4. An opto-electronic module as recited in claim 1 wherein the semiconductor chip package includes:
   a semiconductor die that is at least partially encapsulated within a protective molding material;
   wherein the top electrical contacts of the chip package comprise electrical contacts formed on a top surface of the semiconductor die such that that the contacts are exposed through a surface of the protective molding material; and
   wherein the optical device package is mounted to the top surface of the protective molding material such that the optical device package is electrically connected to the chip package using the electrical traces of the support block and the exposed electrical contacts.

5. Art opto-electronic module as recited in claim 4 wherein the optical device package is suitable for receiving or sending optical signals; and
   wherein the support block includes electrical traces formed on a flex tape that is mounted on the support block and extends from the first face to the second face of the block so that the optical device package is electrically connected to the electrical traces of the flexi tape and the exposed electrical contacts of the semiconductor package.

6. An opto-electronic module as recited in claim 5 wherein there are a plurality of photonic devices attached to the support block, wherein at least one photonic device is configured to receive optical signals and at least one photonic device is configured to send optical signals.

7. An opto-electronic module as recited in claim 5 further comprising:
   an electrical converter that is located on the second face of the support block such that single ended signals travel between the photonic device and the electrical converter, wherein the electrical converter converts single ended signals from the photonic device into differential signals such that differential signals are transmitted to the electrical port and wherein the electrical converter converts differential signals from the electrical port into single ended signals that are transmitted to the photonic device.

8. An opto-electronic module as recited in claim 7 wherein the electrical converter located on the second face is located in close proximity to the optical device package.

9. An opto-electronic module as recited in claim 4 further comprising:
   a barrel unit that is attached to the optical device package, the barrel unit having at least one hollow tube that provides optical access to the optical device package.

10. An opto-electronic module as recited in claim 1 wherein the first and second faces of the support block are substantially perpendicular to one another.

11. An opto-electronic module as recited in claim 1 wherein the opto-electronic device further comprises:
    a semiconductor device package having a semiconductor die that is at least partially encapsulated within a protective molding material; and
    an optical device package that is in electrical communication with the semiconductor device package.

12. An opto-electronic module as recited in claim 11 wherein the optical device package further comprises:
at least one photonic device suitable for receiving or sending optical signals.

13. An opto-electronic module as recited in claim 1 wherein the first substrate further comprises:
at least one electronic device attached to a surface of the first substrate wherein the electronic device is secured to a position that is directly adjacent to the semiconductor chip package.

14. An opto-electronic module as recited in claim 1 wherein the first substrate is substantially rigid.

15. An opto-electronic module as recited in claim 1 wherein the second substrate has a top surface and a bottom surface, and wherein the electrical port includes electrical contacts on the top surface, bottom surface, or top and bottom surfaces of the second substrate.

16. An opto-electronic module as recited in claim 1 wherein the first and second substrates are printed circuit boards.

17. An opto-electronic module as recited in claim 1 wherein the electrical and the optical ports face in opposite directions.

18. An opto-electronic module as recited in claim 1 wherein the second substrate is substantially rigid.

19. An opto-electronic module as recited in claim 1, wherein the first and second substrates are substantially rigid.

20. An opto-electronic module as recited in claim 1 wherein the opto-electronic module is suitable for sending, receiving, or sending and receiving data signals at a rate of approximately 2.5 Giga bytes per second or greater.

21. An opto-electronic module as recited in claim 1 further comprising:
a case that contains the opto-electronic module wherein the case has an optical interface opening to provide access to the optical port and an electrical interface opening to provide access to the electrical port.

22. An opto-electronic module as recited in claim 1 wherein the flex connector is integrally formed with the first and the second substrate.

23. An opto-electronic module as recited in claim 22 wherein the integrally formed flex connector comprises a thinned substrate integrally formed as part of the first and the second substrate.

24. An opto-electronic module as recited in claim 1 wherein the external case is configured to connect with a standard electro-optic form factor and configured so that the case enables optical communication between the optical device package and an external optical component and enables electrical connection between the port end of the second substrate and an external electrical connector.

25. An opto-electronic module as recited in claim 24 wherein the first substrate defines an optical plane and the second substrate defines an electrical plane and the external case is further configured to secure the substrates at two different heights defined by the electro-optic form factor for which the module is to be employed.

26. An opto-electronic module as recited in claim 24 wherein the first substrate is mounted to the bottom interior surface of the external case and the second substrate is elevated above the bottom interior surface of the external case and not in contact with an upper interior surface of the external case.

27. An opto-electronic module having an optical port and an electrical port comprising:
a first planar substrate having electrical traces, an optical port end, and an opposite interior end;
an opto-electronic device attached to and electrically connected to the first substrate at the optical port end, wherein the opto-electronic device serves as the optical port wherein the opto-electronic device comprises:
a semiconductor chip package having upper chip electrical contacts on a top surface of the package and having lower chip electrical contacts on a lower surface of the package, the package being mounted directly on top of the first substrate;
a support block having a first face and a second face that are angled relative to one another with electrical traces that extend from the first face to the second face wherein the first face of the support block is mounted on top of the chip package so that at least some of the upper chip electrical contacts are electrically coupled to associated traces on the first face of the support block; and
a optical device package mounted on the second face of the support block, the optical device package having at least one active facet thereon and having electrical contacts that are electrically coupled to associated traces on the support block;
a second planar substrate having electrical traces, the second substrate having a part end on an end opposite from an interior end, wherein the port end forms the electrical port for electrically connecting the opto-electronic module with an external electrical device; and
an intermediate substrate of a predetermined offset thickness containing a plurality of electrically conductive lines, wherein the plurality of electrically conductive lines of the intermediate substrate connect the electrical traces of the first and the second substrates, wherein the thickness of the intermediate substrate separates the height of the optical port with respect to the height of the electrical port by a desired offset distance.

* * * * *

UNITED STATES PATENT AND TRADEMARK OFFICE
CERTIFICATE OF CORRECTION

PATENT NO. : 7,156,562 B2 Page 1 of 1
APPLICATION NO. : 10/621035
DATED : January 2, 2007
INVENTOR(S) : Mazotti et al.

It is certified that error appears in the above-identified patent and that said Letters Patent is hereby corrected as shown below:

Column 7, line 30, change "tat allow" to --that allow--.

In line 39 of claim 1 (column 11, line 62) change "ease" to --case--.

In line 1 of claim 5 (column 12, line 23) change "Art" to --An--.

In line 5 of claim 5 (column 12, line 27) change "flex tape" to --flexi tape--.

In line 5 of claim 26 (column 14, line 9) change "ease" to --case--.

In line 28 of claim 27 (column 14, line 40) change "part end" to --port end--.

Signed and Sealed this

Twenty-eighth Day of August, 2007

JON W. DUDAS
*Director of the United States Patent and Trademark Office*